(12) United States Patent
Peck, Jr.

(10) Patent No.: US 9,472,946 B2
(45) Date of Patent: Oct. 18, 2016

(54) ELECTRICAL POWER DISTRIBUTION NETWORK MONITORING AND CONTROL

(71) Applicant: THE BOEING COMPANY, Chicago, IL (US)

(72) Inventor: James Leo Peck, Jr., Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 607 days.

(21) Appl. No.: 13/962,441

(22) Filed: Aug. 8, 2013

(65) Prior Publication Data
US 2015/0043119 A1 Feb. 12, 2015

(51) Int. Cl.
| | |
|---|---|
| *H02H 3/00* | (2006.01) |
| *H02H 7/26* | (2006.01) |
| *G01R 33/02* | (2006.01) |
| *H02J 3/00* | (2006.01) |
| *H02J 13/00* | (2006.01) |

(52) U.S. Cl.
CPC .............. *H02H 7/263* (2013.01); *G01R 33/02* (2013.01); *H02J 3/00* (2013.01); *H02J 13/0075* (2013.01); *H02J 13/0062* (2013.01); *H02J 2003/001* (2013.01); *Y02E 60/725* (2013.01); *Y02E 60/74* (2013.01); *Y02E 60/7838* (2013.01); *Y02E 60/7853* (2013.01); *Y04S 10/20* (2013.01); *Y04S 10/30* (2013.01); *Y04S 10/525* (2013.01); *Y04S 40/124* (2013.01); *Y04S 40/126* (2013.01)

(58) Field of Classification Search
USPC ........................................................ 361/63
See application file for complete search history.

(56) References Cited

U.S. PATENT DOCUMENTS

| | | |
|---|---|---|
| 352,105 A | 11/1886 | Zipernowsky |
| 2,411,374 A | 11/1946 | Horstman |
| 2,569,675 A | 10/1951 | Keefe |
| 3,042,849 A | 7/1962 | Dortort |
| 3,411,121 A | 11/1968 | Twomey |
| 3,451,130 A | 6/1969 | Ellis |
| 3,464,002 A | 8/1969 | Hentschel |
| 4,020,440 A | 4/1977 | Moerman et al. |
| 4,338,657 A | 7/1982 | Lisin |

(Continued)

FOREIGN PATENT DOCUMENTS

| | | |
|---|---|---|
| DE | 2926423 A1 | 1/1981 |
| DE | 4129265 A1 | 3/1993 |

(Continued)

OTHER PUBLICATIONS

European Patent Office, Extended European Search Report for European Application No. 14179801.7 dated Jul. 10, 2015, 14 pages.

(Continued)

*Primary Examiner* — Ronald W Leja
(74) *Attorney, Agent, or Firm* — Charles L. Moore; Moore & Van Allen PLLC (57) ABSTRACT

An electrical power distribution network may include a plurality of transformers and a local manager associated with a transformer. Each local manager may be configured to monitor and control a magnetic flux level in a magnetic flux core of the associated transformer. The electrical power distribution network may also include a central manager configured to receive magnetic flux level data from each local manager and control operation of each local manager in response to the magnetic flux level data.

20 Claims, 9 Drawing Sheets

(56) References Cited

U.S. PATENT DOCUMENTS

| | | | |
|---|---|---|---|
| 4,520,335 A | 5/1985 | Rauch et al. | |
| 4,520,556 A | 6/1985 | Pasko et al. | |
| 4,565,746 A | 1/1986 | Hayase | |
| 4,668,931 A | 5/1987 | Boenitz | |
| 4,684,882 A | 8/1987 | Blain | |
| 4,897,626 A | 1/1990 | Fitter | |
| 5,351,017 A | 9/1994 | Yano | |
| 5,486,756 A | 1/1996 | Kawakami et al. | |
| 5,534,831 A | 7/1996 | Yabuki | |
| 5,534,837 A | 7/1996 | Brandt | |
| 5,668,707 A | 9/1997 | Barrett et al. | |
| 5,737,203 A | 4/1998 | Barrett | |
| 6,144,282 A | 11/2000 | Lee | |
| 6,181,079 B1 | 1/2001 | Chang et al. | |
| 6,715,198 B2 | 4/2004 | Kawakami | |
| 7,071,807 B1 | 7/2006 | Herbert | |
| 7,106,047 B2 | 9/2006 | Taniguchi | |
| 7,148,675 B2 | 12/2006 | Itoh | |
| 7,342,477 B2 | 3/2008 | Brandt | |
| 7,362,206 B1 | 4/2008 | Herbert | |
| 7,378,828 B2 | 5/2008 | Brandt | |
| 7,639,520 B1 | 12/2009 | Zansky et al. | |
| 8,980,053 B2 | 3/2015 | Krahn et al. | |
| 9,106,125 B1 | 8/2015 | Brandt et al. | |
| 9,159,487 B2 | 10/2015 | Peck | |
| 2002/0163330 A1 | 11/2002 | Sekiya | |
| 2003/0117251 A1 | 6/2003 | Haugs et al. | |
| 2004/0027121 A1 | 2/2004 | Choi et al. | |
| 2004/0051617 A1 | 3/2004 | Buswell | |
| 2004/0124958 A1 | 7/2004 | Watts | |
| 2004/0135661 A1 | 7/2004 | Haugs et al. | |
| 2005/0035761 A1 | 2/2005 | Park et al. | |
| 2006/0082430 A1 | 4/2006 | Sutardja | |
| 2006/0089022 A1 | 4/2006 | Sano | |
| 2006/0197480 A1 | 9/2006 | Mori et al. | |
| 2008/0150664 A1 | 6/2008 | Blankenship | |
| 2008/0163475 A1 | 7/2008 | Snyder | |
| 2009/0244937 A1 | 10/2009 | Liu | |
| 2010/0134058 A1 | 6/2010 | Nagashima et al. | |
| 2010/0164673 A1 | 7/2010 | Shim | |
| 2010/0194373 A1 | 8/2010 | Hamberger et al. | |
| 2011/0095858 A1 | 4/2011 | Spurny | |
| 2011/0163834 A1 | 7/2011 | Stahmann et al. | |
| 2011/0210722 A1 | 9/2011 | Paci et al. | |
| 2011/0279212 A1 | 11/2011 | Ikriannikov et al. | |
| 2012/0150679 A1 | 6/2012 | Lazaris | |
| 2012/0226386 A1 | 9/2012 | Kulathu et al. | |
| 2013/0043725 A1 | 2/2013 | Birkelund | |
| 2013/0049751 A1 | 2/2013 | Hamberger et al. | |
| 2014/0022040 A1 | 1/2014 | Peck | |
| 2014/0210585 A1 | 7/2014 | Peck, Jr. | |
| 2014/0232384 A1* | 8/2014 | Peck, Jr. | G01R 33/04 324/244 |
| 2015/0043119 A1* | 2/2015 | Peck, Jr. | G01R 33/02 361/93.6 |

FOREIGN PATENT DOCUMENTS

| | | |
|---|---|---|
| EP | 1345036 A2 | 9/2003 |
| EP | 2688076 A2 | 1/2014 |
| JP | 01242333 A | 9/1989 |
| JP | 09077452 A | 3/1997 |
| JP | 2001167933 A | 6/2001 |
| JP | 2011238653 A | 11/2011 |
| WO | 2007078403 A2 | 7/2007 |
| WO | 2014130122 A1 | 8/2014 |

OTHER PUBLICATIONS

Fedder, Gary K., et al.; "Laminated High-Aspect-Ratio Microstructures in a Conventional CMOS Process," Proceedings of the IEEE Micro Electro Mechanical Systems Workshop, 1996, pp. 13-18.

Chee, Clinton Y.K., et al.; "A Review on the Modelling of Piezoelectric Sensors and Actuators Incorporated in Intelligent Structures," Journal of Intelligent Material Systems and Structures, 1998, pp. 3-19, vol. 9.

Wilson, Earl J.; "Strain-Gage Instrumentation," Harris' Shock and Vibration Handbook, 2002, pp. 17.1-17.15, Chapter 17, 5th Edition.

Simoes Moita, Jose M., et al.; "Active control of adaptive laminated structures with bonded piezoelectric sensors and actuators," Computers and Structures, 2004, pp. 1349-1358, vol. 82.

European Patent Office; International Search Report and Written Opinion for International Application No. PCT/US2013/072789 dated May 27, 2014, 12 Pages.

European Patent Office, European Patent Application No. 14178702.8, European Search Report dated Jan. 21, 2015, 7 pages.

European Patent Office; Extended European Search Report for European Patent Application No. 13173067.3 dated Nov. 3, 2015, 9 Pages.

International Bureau of WIPO; International Preliminary Report on Patentability for International Application No. PCT/US2013/072789 dated Aug. 25, 2015, 9 Pages.

\* cited by examiner

ELECTRICAL POWER DISTRIBUTION NETWORK MONITORING AND CONTROL

CROSS-REFERENCE TO RELATED APPLICATIONS

The present application is related to U.S. patent application Ser. No. 13/553,267, filed Jul. 19, 2012, now U.S. Pat. No. 9,159,487, entitled "Linear Electromagnetic Device" which is assigned to the same assignee as the present application.

The present application is also related to U.S. patent application Ser. No. 13/773,135, filed Feb. 21, 2013, entitled "Magnetic Core Flux Sensor" which is assigned to the same assignee as the present application.

The present application is also related to U.S. patent application Ser. No. 13/953,314, filed Jul. 29, 2013, entitled "Transformer Core Flux Control for Power Management" which is assigned to the same assignee as the present application.

FIELD

The present disclosure relates to electrical power distribution networks or systems, and more particularly to a system and method for monitoring and controlling components of an electrical power distribution network or system.

BACKGROUND

Electrical power distribution networks represent challenges in monitoring in real-time for efficient operation and to prevent faults or other conditions that could potentially cause damage to components of the power distribution network or to loads or equipment of electrical power consumers connected to the power distribution network. Aircraft, ships and municipal electrical power distribution systems or networks depend on voltage, current and thermal monitoring systems to protect components of these systems or networks from potentially being damaged due to electrical faults or other anomalies, such as lightning strikes or other natural occurrences, human causes or other changes associated with the network. These systems may respond to changes in performance over a period of time. Alternating current (AC) voltage and current are typically averaged over many cycles and thermal changes may be averaged over several minutes before any actions may be taken. Accordingly, such measurements and evaluations may be slow in responding to critical changes to performance of the electrical distribution network or system.

SUMMARY

In accordance with an embodiment, an electrical power distribution network may include a plurality of transformers and a local manager associated with each transformer. Each local manager may be configured to monitor and control a magnetic flux level in a magnetic flux core of the associated transformer. The electrical power distribution network may also include a central manager configured to receive magnetic flux level data from each local manager and control operation of each local manager in response to the magnetic flux level data.

In accordance with another embodiment, a transformer for use in a power distribution network may include a magnetic flux core and an opening formed through the magnetic flux core. A conductor winding may be received in the opening and extend through the magnetic flux core. An electrical current flowing through the conductor winding generates a magnetic field about the conductor winding and a magnetic flux flow about the opening in the magnetic flux core. A core flux sensor arrangement detects a magnetic flux level in the magnetic flux core. A local manager may be configured to adjust the electrical current flowing through the conductor winding to control the magnetic flux level in the magnetic flux core. The local manager may also be configured to transmit magnetic flux data to a central manager of the power distribution network and to receive instructions from the central manager to control the magnetic flux level in the magnetic flux core.

In accordance with further embodiment, a method for monitoring and controlling operation of an electrical power distribution network may include providing monitoring and control of a magnetic flux level in a magnetic flux core of each of a plurality of transformers of the electrical power distribution network. The method may also include collecting magnetic flux level data from each of the plurality of transformers. The method may further include reconfiguring the power distribution system in response to the magnetic flux level data to prevent harm to the electrical power distribution network and any equipment connected to the power distribution network.

BRIEF DESCRIPTION OF THE SEVERAL VIEWS OF DRAWINGS

The following detailed description of embodiments refers to the accompanying drawings, which illustrate specific embodiments of the disclosure. Other embodiments having different structures and operations do not depart from the scope of the present disclosure.

DESCRIPTION

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

In accordance with an embodiment of the present disclosure, a linear inductor is an electromagnetic device having only one electrical conductor wire winding or windings passing through a magnetic core. In accordance with another embodiment, a linear transformer is an electromagnetic device where a linear primary electrical conductor wire winding or windings and one or more linear secondary electrical conductor wire winding or windings pass through a magnetic core. The core may be one piece and no turns of the primary and secondary electrical conductors about the core are required. While the core may be one piece, the one piece core may be formed from a plurality of stacked plates or laminates. A current may be conducted through the primary. A magnetic flux from the current in the primary is absorbed by the core. When the current in the primary decreases the core transmits an electromotive force (desorbs) into the secondary wires. A feature of the linear transformer is the linear pass of the primary and secondary conductors through the core. One core may be used as a standalone device or a series of two or more cores may be used where a longer linear exposure is required. Another feature of this transformer is that the entire magnetic field or at least a substantial portion of the magnetic field generated by the current in the primary is absorbed by the core, and desorbed into the secondary. The core of the transformer may be sized or include dimensions so that substantially the entire magnetic field generated by the current is absorbed by the core and so that the magnetic flux is substantially completely contained with the core. This forms a highly efficient transformer with very low copper losses, high efficiency energy transfer, low thermal emission and very low radiated emissions. Additionally the linear transformer is a minimum of about 50% lower in volume and weight then existing configurations. Linear electromagnetic devices, such as linear transformers, inductors and similar devices are described in more detail in U.S. patent application Ser. No. 13/553,267, filed Jul. 19, 2012, entitled "Linear Electromagnetic Device" which is assigned to the same assignee as the present application and is incorporated herein in its entirety by reference. A magnetic core flux sensor assembly is described in more detail in U.S. patent application Ser. No. 13/773,135, filed Feb. 21, 2013, entitled "Magnetic Core Flux Sensor and is incorporated herein in its entirety by reference.

Figure 1:
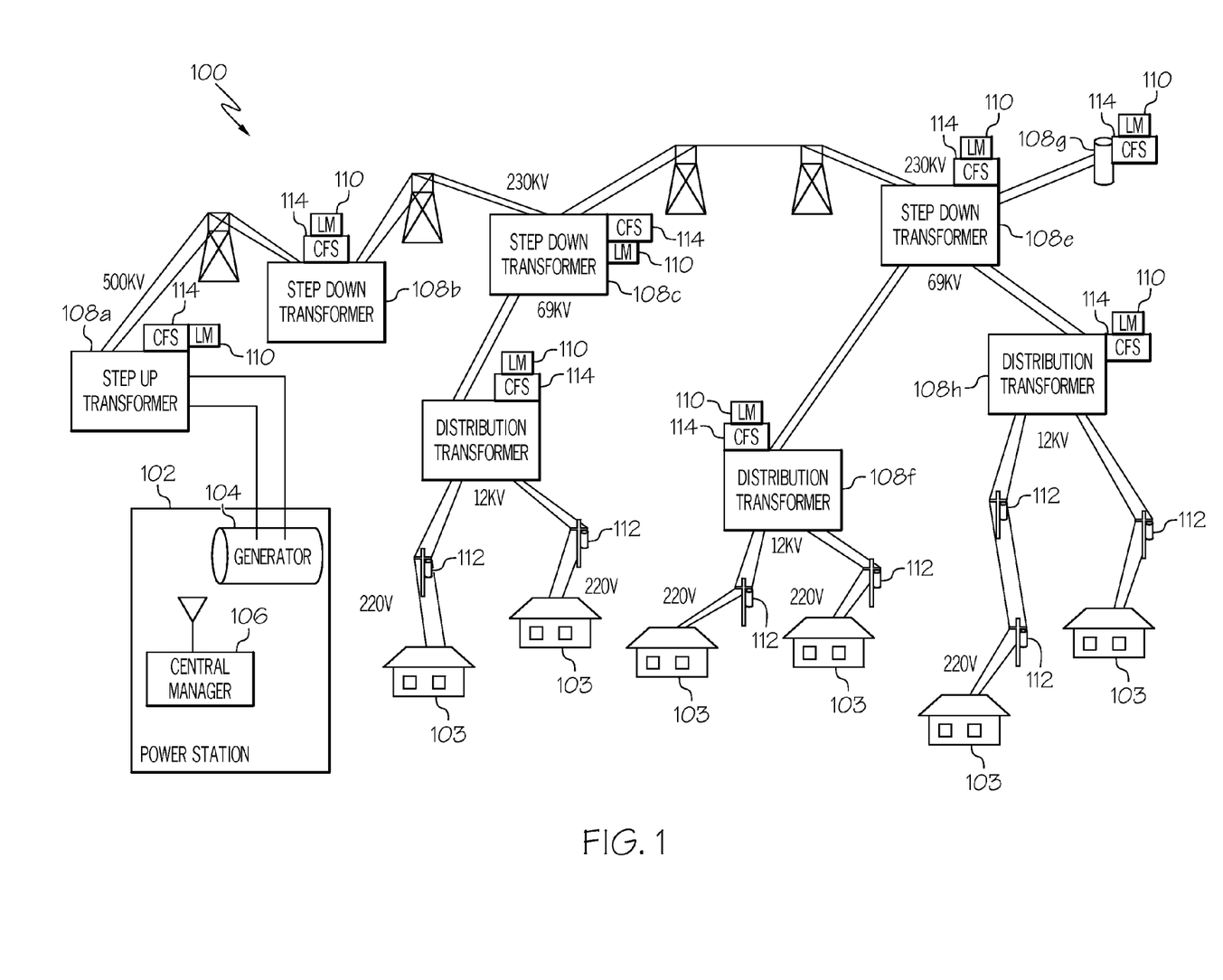
FIG. 1 is block schematic diagram of an example of an electrical power distribution network in accordance with an embodiment of the present disclosure.

FIG. 1 is block schematic diagram of an example of an electrical power distribution network 100 or system in accordance with an embodiment of the present disclosure. The electrical power distribution network 100 may include at least one power station 102 that generates electrical power which is distributed by the power distribution network 100 or system to end users or electrical power consumers 103. The power station 102 may include at least one generator 104 that generates electrical power for distribution over the electrical power distribution network 100. The power station 102 may also include a central manager 106. While the central manager 106 is shown as being part of the power station 102, in other embodiments, the central manager 106 may be separate from the power generation station 102.

The electrical power distribution network 100 may also include a plurality of transformers 108a-108h. The transformers 108a-108h may be different types of transformers, such as stepped-up transformers and step-down transformers. As is known in the art, a step-up transformer increases a voltage received by a primary conductor winding of the transformer which is transmitted by a secondary conductor winding of the transformer. A step-down transformer decreases the voltage received by the primary conductor winding of the transformer which is transmitted by the secondary conductor windings of the transformer.

A local manager 110 may be associated with each transformer 108a-108h. Each local manager 110 may be configured to monitor and control a magnetic flux level in a magnetic flux core of the associated transformer 108a-108h. The electrical power distribution network 100 may also include other transformers 112 that may not have a local manager 110 associated with them. The central manager 106 may be configured to receive magnetic flux level data from each local manager 110 and may control operation of each local manager 110 in response to the magnetic flux level data. The central manager 106 may be configured to analyze the magnetic flux level data from each local manager 110 and transmit an individual instruction to at least some local managers 110 for controlling the magnetic flux level in the associated transformer 108a-108e in response to the analysis of the magnetic flux level data. Each local manager 110 may control a configuration of the associated transformer 108a-108h to control the magnetic flux flowing in a core of the associated transformer 108a-108e and thereby control a voltage and current supplied by the associated transformer 108a-108h. As described in more detail with respect to FIG. 5 and FIG. 10, the local manager 110 may control the configuration of the associated transformer 108a-108h by controlling a number of conductor windings in the primary of the transformer or by controlling an amount of current flowing in the primary conductor windings.

Communications between the central manager 106 and each of the local managers 110 may be via a wireless communications arrangement or a wired communications network. For example, the central manager 106 and each of the local managers 110 may include a radio frequency (RE) transceiver for communications with one another over a dedicated wireless RE communications network or may communicate over a public cellular telecommunications network or both. The central manager 106 and each of the local managers 110 may also each include a microprocessor or other computing device for performing the functions and operations described herein. An example of functions and operations that may be performed by the central manager 106 will be described in more detail with reference to the flow chart in FIG. 3. An example of functions and operations that may be performed by the central manger 106 and the local mangers 110 in coordination with one another will be described with reference to the flow chart in FIG. 9. An example of functions and operations that may be performed by each local manager 110 will be described in more detail with reference to the flow chart in FIG. 10.

A core flux sensor arrangement 114 may be coupled to each local manager 110. The core flux sensor arrangement 114 may be configured to detect a magnetic flux level in the magnetic flux core of the associated transformer 108a-108h.

The local manager 110 is configured to receive the magnetic flux level data and to adjust the electrical current flowing through a primary conductor windings of the associated transformer 108a-108h to control the magnetic flux level in the magnetic flux core and thereby control the current supplied by the secondary windings of the transformer 108a-108h. An example of a transformer including a core flux sensor arrangement and local manager will be described in more detail with reference to FIG. 5. The local manager 110 and core flux sensor arrangement 114 may define at least part of a core flux control system as described with reference to FIG. 5.

Figure 2:
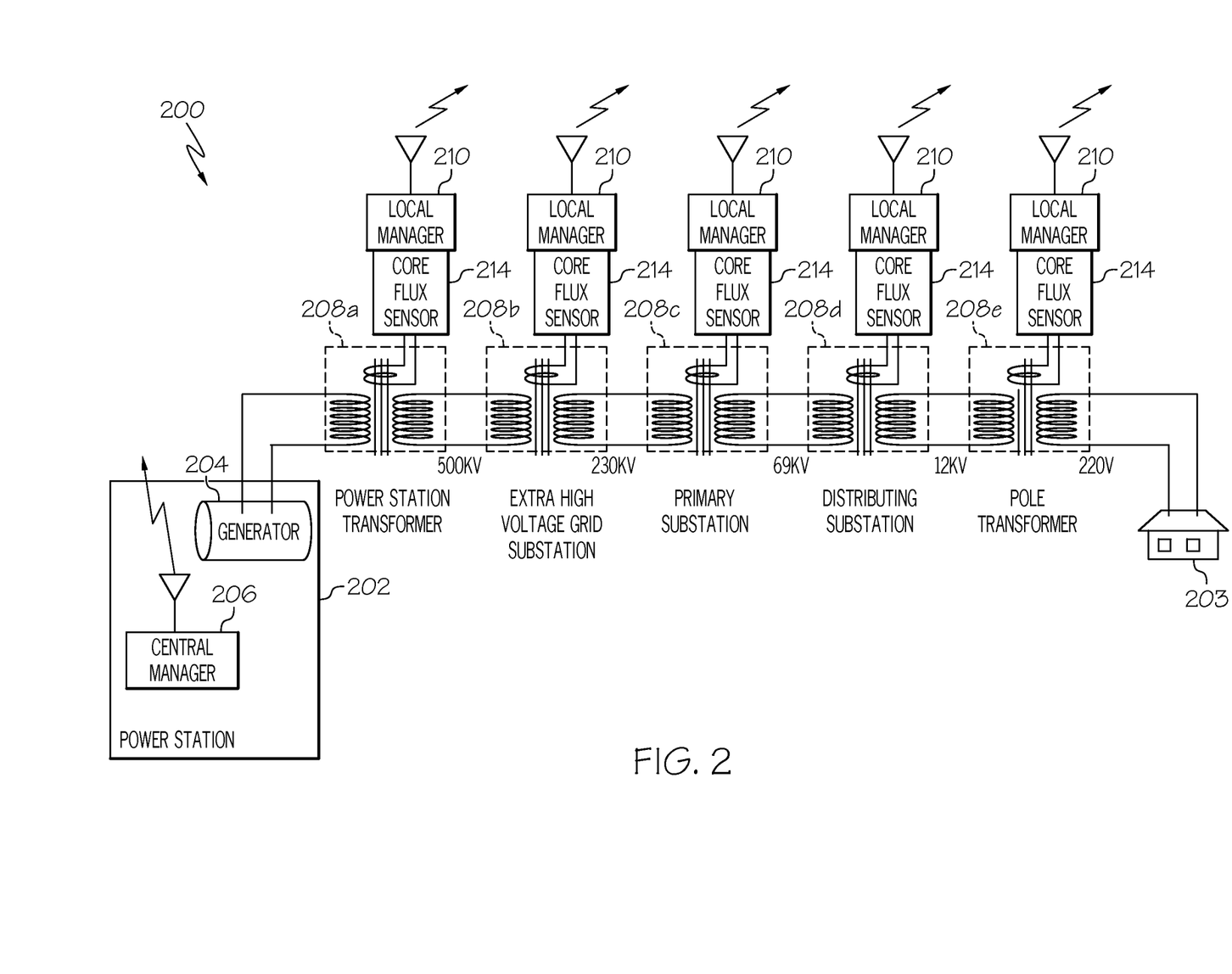
FIG. 2 is schematic diagram of an example of an electrical power distribution circuit within an electrical power distribution network in accordance with an embodiment of the present disclosure.

FIG. 2 is schematic diagram of an example of an electrical power distribution circuit 200 between a power station 202 and an end user or consumer 203 of electrical power in accordance with an embodiment of the present disclosure. The electrical power distribution circuit 200 may be part of an electrical power distribution network, such as network 100 in FIG. 1. The power station 202 may be similar to the power station 102 in FIG. 1. The power station may include a generator 204 and a central manager 206. The central manager 206 may be similar to the central manager 106 of FIG. 1 and may perform similar functions and operations. The central manager 106 may be configured to control a level of electrical power transmitted on the power distribution circuit 200 to the electrical power end user 203 or consumer.

The electrical power distribution circuit 200 may include a plurality of transformers 208a-208e. For example, the electrical power distribution circuit 200 may include a power station transformer 208a that may step-down the voltage from the power station generator 204 to 500 kilovolts (kV) on the secondary of the power station transformer 208a. An extra high voltage grid substation transformer 208b may be coupled to the power station transformer 208a and may step-down the voltage to 230 kV on the secondary of the extra high voltage grid substation transformer 208b. A primary substation transformer 208c may be coupled to the extra high voltage grid substation 208b and may step-down the voltage to 69 kV on the secondary of the primary substation transformer 208c. A distribution substation transformer 208d may be coupled to the primary substation transformer 208c and may step-down the voltage to 12 kV on the secondary of the distribution sub-station 208d. The electrical power distribution circuit 200 may further include a pole transformer 208e or ground transformer coupled to the distribution substation transformer 208d. The transformer 208e may step-down the voltage to 220 V supplied to the end user or consumer 203.

A local manager 210 may be associated with each of the transformers 208a-208e and each of the local managers 210 may be coupled to a core flux sensor arrangement 214. The local manager 210 and the core flux sensor arrangement 214 may be similar to the local manager 110 and core flux sensor arrangement 114 in FIG. 1 and may operate in a similar manner.

Figure 3:
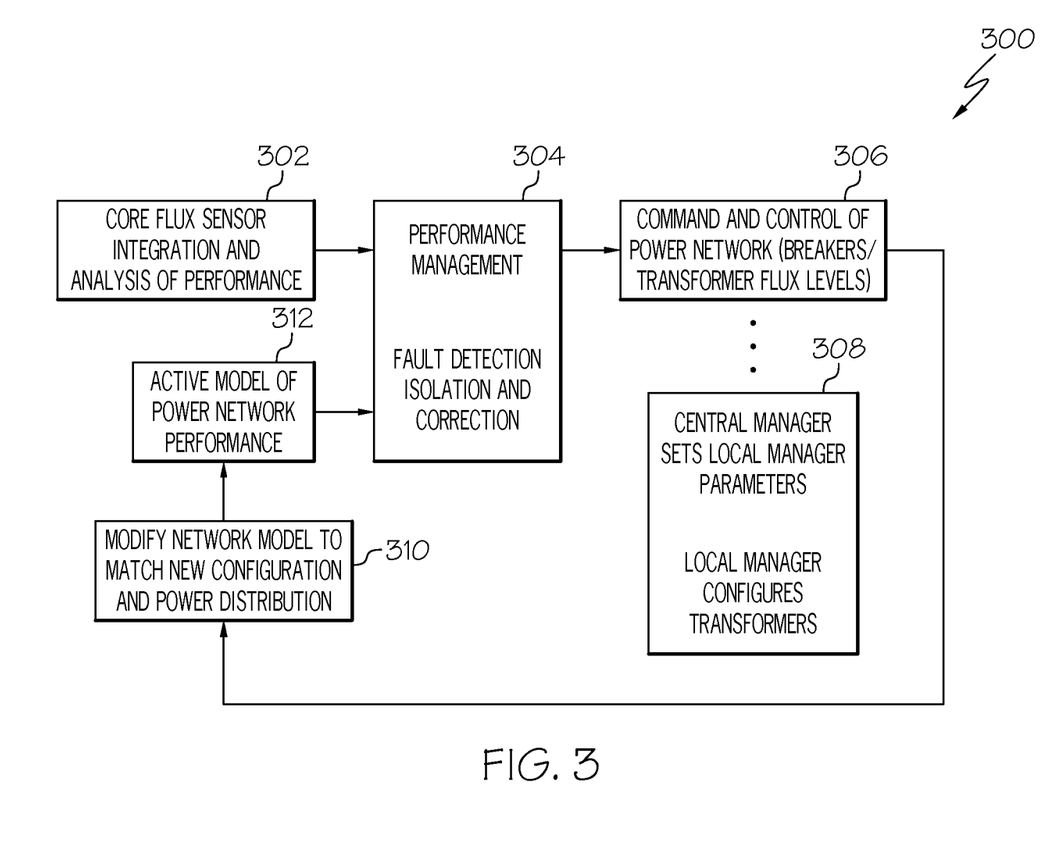
FIG. 3 is a flow chart of an example of a method of operation of a central manager that monitors core flux sensor levels within an electrical power distribution network and controls power distribution within the network in accordance with an embodiment of the present disclosure.

FIG. 3 is a flow chart of an example of a method 300 of operation of a central manager that monitors core flux sensor levels within an electrical power distribution network and controls power distribution within the network in accordance with an embodiment of the present disclosure. The method 300 may be embodied in and performed by the central manager 106 in FIG. 1 or the central manager 206 in FIG. 2. In block 302, the central manager may receive magnetic flux level data from each of the local managers. The central manager may be configured to integrate the magnetic flux level data from each of the local managers and evaluate performance of each of the transformers and the overall performance of the electrical power distribution network based on the magnetic flux level data.

In block 304, the central manager may manage performance of each of the local managers in controlling and configuring the associated transformers in the electrical power distribution network. For example, the central manager may be configured to detect a fault based on evaluation of the magnetic flux level data. The central manager may then transmit instructions to any affected local manager or local manager or managers associated with the fault to isolate the fault. The local manager may configure the associated transformer to isolate the fault and perform any corrective action in response to receiving the instructions from the central manager.

In block 306, the central manager may be configured to command and control the power distribution network by operating circuit breakers, switches or other electrical power distribution control devices to manage the distribution network based on analysis of the magnetic flux level data received from the local managers.

Similar to that previously described, the central manager may also be configured to control transformer flux levels in the transformers of the electrical power distribution circuit by transmitting instructions to the local managers associated with the transformers. The transformer flux levels may be controlled similar to that described with respect to FIG. 10. For example, in block 308, the central manager may be adapted to set at least one local manager parameter. The at least one local manager parameter may be set by the instructions transmitted to the local manager by the central manager. The local manager may then configure the associated transformer in response to the at least one local manager parameter. For instance, the transformer may be configured by adjusting the number of primary conductor windings, controlling the amount of current in the primary conductor windings or by any other mechanism to control the magnetic flux level within the magnetic core of the associated transformer.

In block 310, a network model maintained by the central manager may be modified to match a new configuration of the electrical power distribution network in response to a change in the configuration of the electrical power distribution network in blocks 306 and 308 or changes in configuration of any transformers of the distribution network.

In block 312, an active model of the power distribution network performance is stored and maintained by the central manager.

Figure 4:
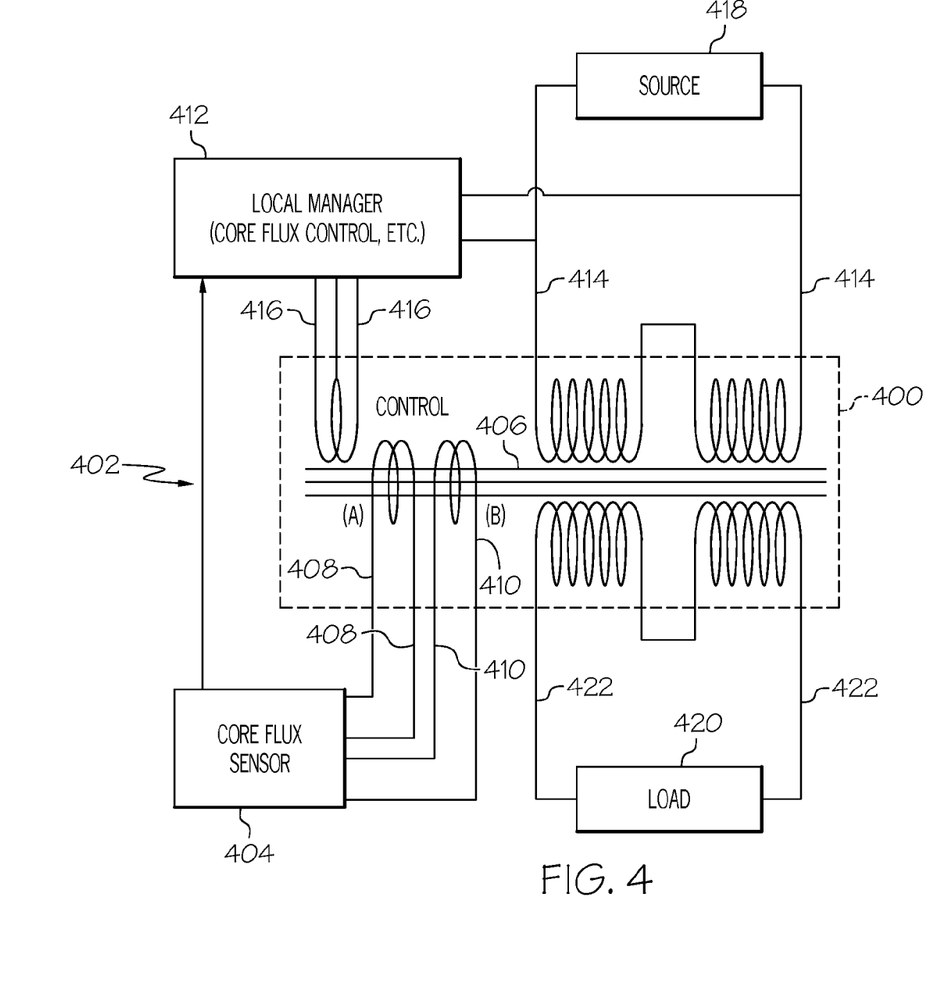
FIG. 4 is a block schematic diagram of an example an electromagnetic device and a core flux control system in accordance with an embodiment of the present disclosure.

FIG. 4 is a block schematic diagram of an example of an electromagnetic device 400 and a core flux control system 402 in accordance with an embodiment of the present disclosure. An example of a core flux control system that may be used for the core flux control system 402 is described in U.S. patent application Ser. No. 13/953,314, entitled "Transformer Core Flux Control for Power Management," filed Jul. 29, 2013, assigned to the same assignee as the present application and incorporated herein by reference in its entirety. The core flux control system 402 may include a core flux sensor arrangement 404 or device that detects the magnetic flux flow in the magnetic flux core 406 of the electromagnetic device 400 and measures a level of the magnetic flux flow in the magnetic flux core 406. The core flux sensor arrangement 404 may detect the magnetic flux flow in the magnetic flux core 406 by one or more flux sensor windings 408 and 410 wound through an interior of the core 406 as described in more detail with reference to FIG. 5. The core flux sensor arrangement 404 provides a signal corresponding to the magnetic flux level in the magnetic core 406 of the electromagnetic device 400 or transformer at a location of the flux sensor windings 408 and 410 to a local manager 412. The local manager 412 may include a core flux control device or may be a core flux control device similar to that described in U.S. patent application Ser. No. 13/953,314. The local manager 412 is configured to adjust the electrical current flowing through a primary conductor winding 414 or windings to control the magnetic flux level in the magnetic flux core 406. The local manager 412 may be configured to adjust a number of turns in the conductor winding by adding or subtracting turns to maintain a predetermined magnetic flux level in the magnetic flux core 406. For example, the core flux sensor arrangement 404 may detect the magnetic flux level in the magnetic flux core 406 when a peak source current is flowing through the primary conductor winding 414. The local manager 412 may increase the electrical current flow or increase an amplitude of the electrical current flowing through the primary conductor winding 414 in response to the magnetic flux level being lower than the predetermined level for the peak source current, and the local manager 412 may reduce the electrical current or reduce an amplitude of the current flowing through the conductor winding 414 in response to the level of the magnetic flux flow being higher than the predetermined level for the peak current.

As previously discussed, the local manager 412 may also be connected to an additional winding or control winding 416 or windings. In addition to controlling the amount or amplitude of current flowing in the primary conductor winding 414, the local manager 412 or core flux control device may also switch in or out the control winding 416 and may increase or decrease electrical current flowing in the control winding 416 to further control the magnetic flux level in the core 406.

The local manager 412 may also control or alternatively control an amount or amplitude of current in the primary conductor windings from an electrical source 418. The electromagnetic device 400 or transformer may provide electrical power to a load 420 coupled to the secondary winding or windings 422 of the electromagnetic device 400.

Figure 5:
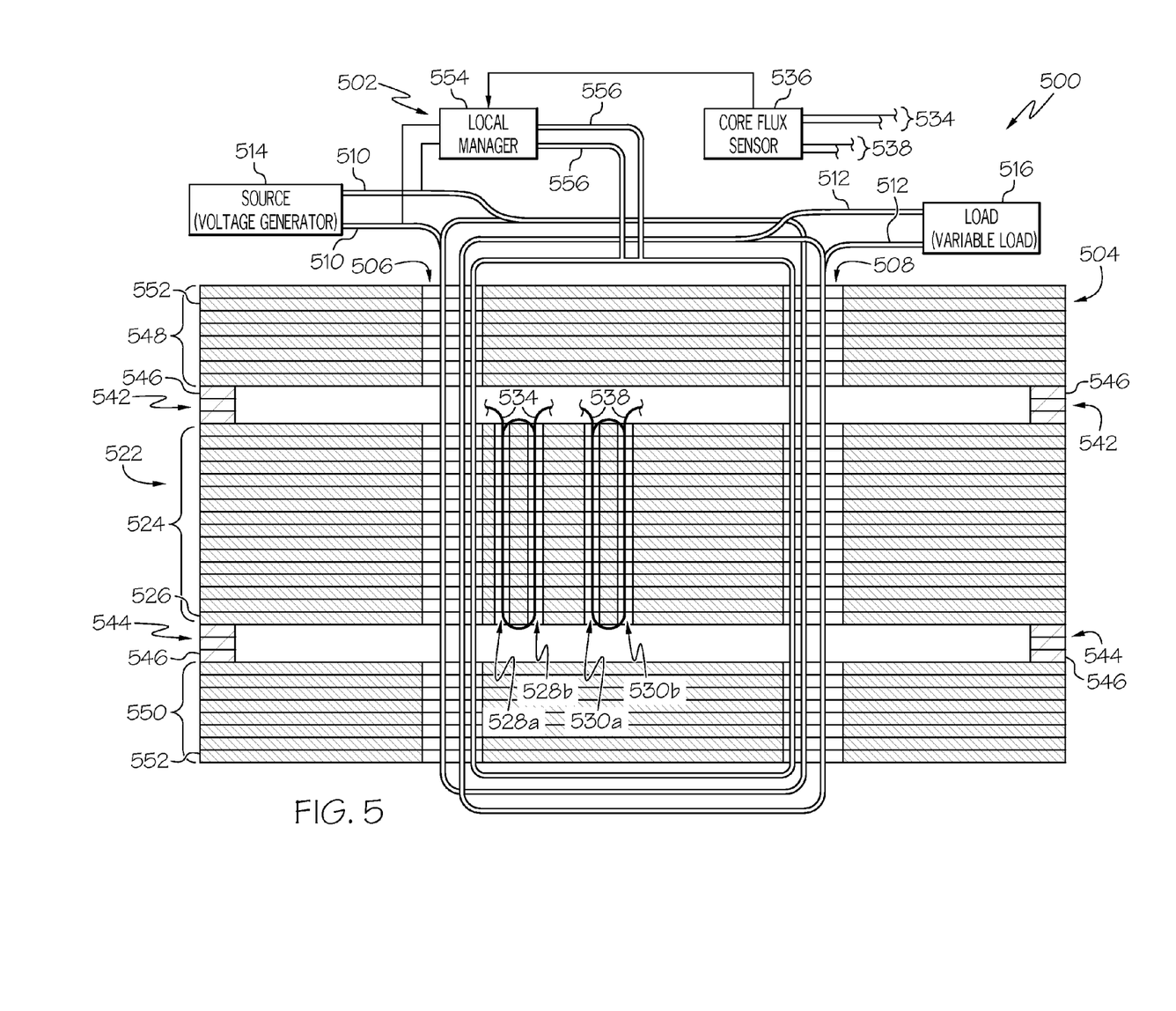
FIG. 5 is a side cross-sectional view of an example of an electromagnetic device and a core flux control system in accordance with an embodiment of the present disclosure.

FIG. 5 is a cross-sectional view of an example of an electromagnetic device 500 and core flux control system 502 in accordance with an embodiment of the present disclosure. The electromagnetic device 500 may be used for the electromagnetic device 400 in FIG. 4. The electromagnetic device 500 and core flux control system 502 may also be embodied in each of the transformers 108a-108h, associated local managers 110 and associated core flux sensor arrangements 114 of FIG. 1. The electromagnetic device 500 and core flux control system 5902 may further be embodied in the transformers 208a-208e, associated local managers 210 and associated core flux sensor arrangements 214 of FIG. 4.

The electromagnetic device 500 may include a magnetic flux core 504. As described in more detail herein, the core flux control system 502 may be configured to adjust an electrical current flowing through a conductor winding to control a magnetic flux level in the magnetic flux core 504. A first opening 506 and a second opening 508 may be formed through the magnetic core 504. The first opening 506 and the second opening 508 may be elongated openings similar to that illustrated in FIGS. 6 and 8. The exemplary electromagnetic device 500 illustrated in FIG. 5 may be configured as a transformer and may include a primary conductor winding 510 and a secondary conductor winding 512. The primary conductor winding 510 may extend through the first opening 506 and the second opening 508 and may be coupled to a source 514 of electrical power. The source 514 may be a voltage generator. The secondary conductor winding 512 may also extend through the first opening 506 and the second opening 508 and maybe coupled to a load 516. The load 516 may be a variable load. An electrical current flowing through the primary conductor winding 510 generates a magnetic field around the primary conductor winding 510 and a magnetic flux flow is created in the magnetic core 504 as illustrated by arrows 518 and 520 in FIGS. 6 and 8. The magnetic flux flow in the magnetic core 504 will be in opposite directions about the respective elongated openings 506 and 508, as illustrated by arrows 518 and 520, because of the direction of electric current flow in the primary winding 510 (FIG. 5) through the elongated openings 506 and 508 and the right-hand rule. Based on the right-hand rule, electric current flowing into the page on FIG. 6 in windings 510 through elongated opening 510 will cause a magnetic flux flow in the direction of arrow 518 in the example in FIG. 6, and electric current flowing out of the page in the same windings 510 in FIG. 6 through elongated opening 508 will cause a magnetic flux flow in the direction of arrow 520.

While the exemplary electromagnetic device 500 illustrated in FIG. 5 has been described as having a first opening 506 and a second opening 508 through the magnetic flux core 504 and primary and secondary windings 510 and 512 through the openings 506 and 508, other embodiments may have a single opening. A primary conductor winding and a secondary conductor winding may extend through the single opening forming an electromagnetic device configured as a transformer. In another embodiment, a single conductor winding may extend through the single opening through the magnetic flux core. An electromagnetic device with a single conductor winding is configured as an inductor. The number and use of the windings determines whether the electromagnetic device is an inductor or transformer.

Figure 6:
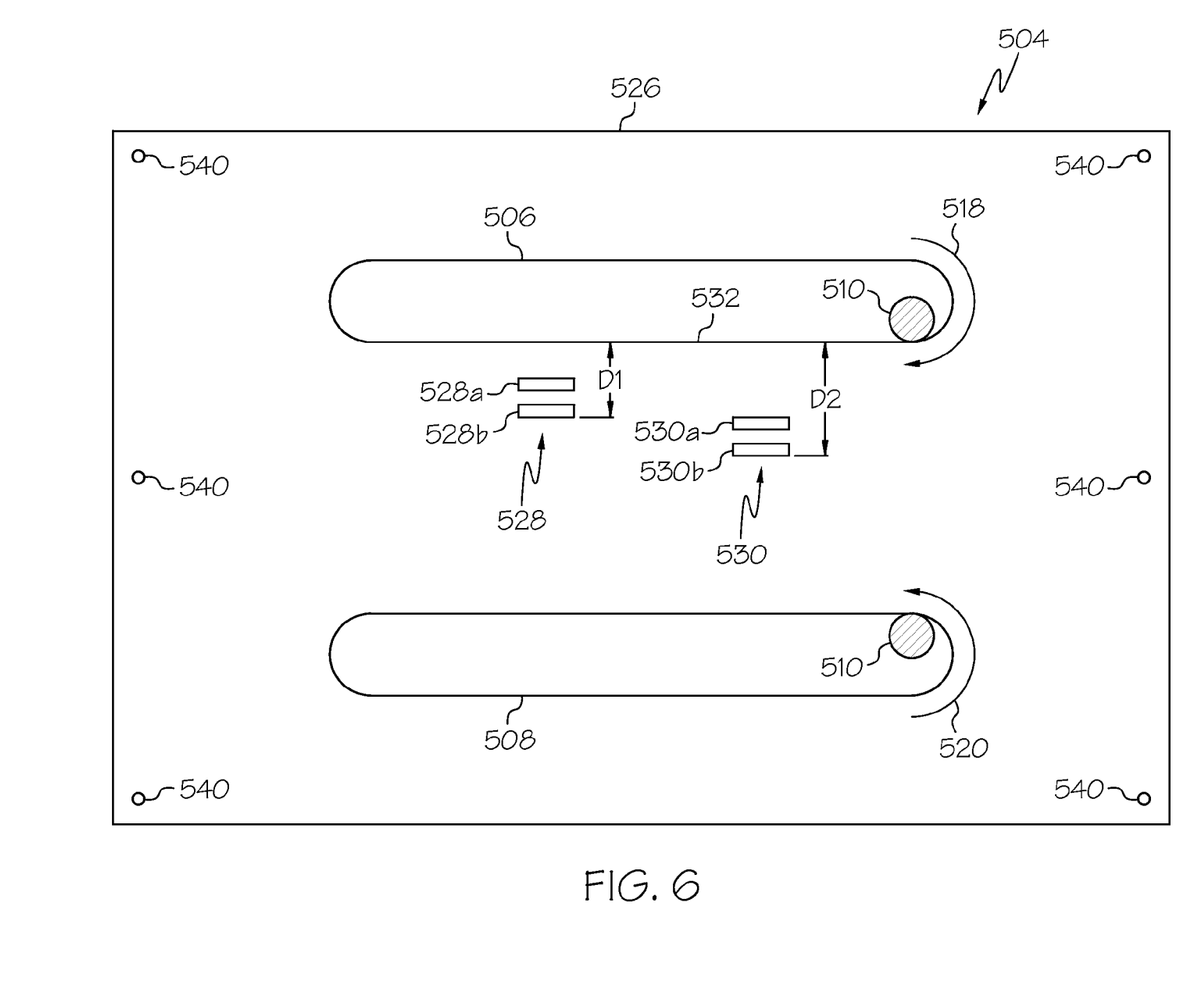
FIG. 6 is a top view of an example of a magnetic flux sensor plate or laminate in accordance with an embodiment of the present disclosure.

The electromagnetic device 500 may include a core flux sensor arrangement 522 to detect a magnetic flux level in the magnetic flux core 504. The magnetic flux core 504 of the electromagnetic device 500 may include a flux sensor core portion 524 that may be part of the core flux sensor arrangement 522. The flux sensor core portion 524 may include a plurality of flux sensor core plates 526 or laminates that are stacked on one another. Referring also to FIG. 6, FIG. 6 is a top view of an example of a magnetic flux sensor plate 526 or laminate in accordance with an embodiment of the present disclosure. Each sensor plate 526 of the flux sensor core portion 524 may include a first pair of sensor holes 528a and 528b and a second pair of sensor holes 530a and 530b for use in sensing a level of the magnetic flux flow 518 at a respective location of each of the first pair of sensor holes 528a and 528b and the second pair of sensor holes 530a and 530b. The first pair of sensor holes 528 and second pair of sensor holes 530 may be disposed along one longitudinal side or side with the longest dimension of the elongated opening 506. The first pair of sensor holes 528a and 528b may be a distance "D1" from an edge 532 of the opening 506 to the sensor hole 528b farthest from the edge 532 of the opening 506. The second pair of sensor holes 530a and 530b may be a distance "D2" from the edge 532 of the opening 506 to the sensor hole 530b farthest from the edge. The spacing between the sensor holes of each pair may be about half the distance "D1." The pairs of sensor holes 528 and 530 are positioned relative to the opening 506 through the magnetic flux core 504 for use in sensing the level of the magnetic flux flow 518 at different distances from the opening 506 while minimizing disruption of the magnetic flux flow 518 in the flux sensor core portion 524 of the magnetic flux core 504.

A sensor conductor winding 534 (FIG. 5) extending through the first pair of sensor holes 528a and 528b and connects to a core flux sensor device 536. A second sensor conductor winding 538 extends through the second pair of sensor holes 530a and 530b and connects to the core flux sensor device 536. The sensor holes 528 and 530 may be substantially elongate as illustrated in FIG. 6 for receiving the sensor windings 534 and 538 or the sensor holes 528 and 530 may be some other shape and size for receiving a particular shape and size of the sensor windings 534 and 538. The magnetic flux flow 518 generates an electrical signal in each of the sensor conductor winding 534 and 538. An amplitude of the electrical signal in each sensor conductor winding 534 and 538 corresponds to the level or magnitude of the magnetic flux flow at the respective location of each sensor conductor winding 534 and 538 or sensor holes 528 and 530. The core flux sensor device 536 may be an oscilloscope or other device for detecting the magnetic flux flow and measuring the level of the magnetic flux flow in the core 504 at the respective location of the pairs of sensor holes 528 and 530 and sensor windings 534 and 538. The sensor windings 534 and 538 define loop antenna sensors as described in more detail below. The core flux sensor arrangement 522 may include the sensor holes 528, 530, the sensor windings 534 and 538 through the sensor holes 528 and 530 and the core flux sensor device 536.

While the exemplary electromagnetic device 500 illustrated in FIG. 1 has been described as having two pairs of sensor holes 528 and 530 and two sensor conductor windings 534 and 538, other embodiments may have a single pair of sensor holes and a single sensor winding or more than two pairs of sensor holes and sensor windings for use in detecting or measuring a magnetic flux level at different locations in a magnetic flux core.

The sensor plates 526 may be made from a material capable of absorbing a magnetic flux. For example, the plates 526 may be made from silicon steel alloy, a nickel-iron alloy or other metallic material capable of absorbing a magnetic flux similar to that described herein. In an embodiment, the core 504 may be a nickel-iron alloy including about 20% by weight iron and about 80% by weight nickel. The plates 526 may be substantially square or rectangular, or may be some other geometric shape depending on the application of the electromagnetic device 500 and the environment where the electromagnetic device may be located.

In accordance with another embodiment, rather than a plurality of pairs of sensor holes 528 and 530, there may be a plurality of single sensor holes. Each sensor hole may be positioned relative to the at least one elongated opening 506 for preventing significant disruption of the magnetic flux flow in the sensor core portion 522 and for use in sensing the magnetic flux flow at different distances from the edge 532 of the at least one elongated opening 506. The sensor conductor winding may be a single wire or antenna element in each single sensor hole. The single sensor holes may be substantially circular or round or may be shaped to accommodate a size and shape of the single wire or antenna element.

Holes 540 may be formed in each of the flux sensor core plates 526 for receiving a fastener for assembling a plurality of sensor core plates 526 together in a stack as illustrated in FIG. 5.

Figure 7:
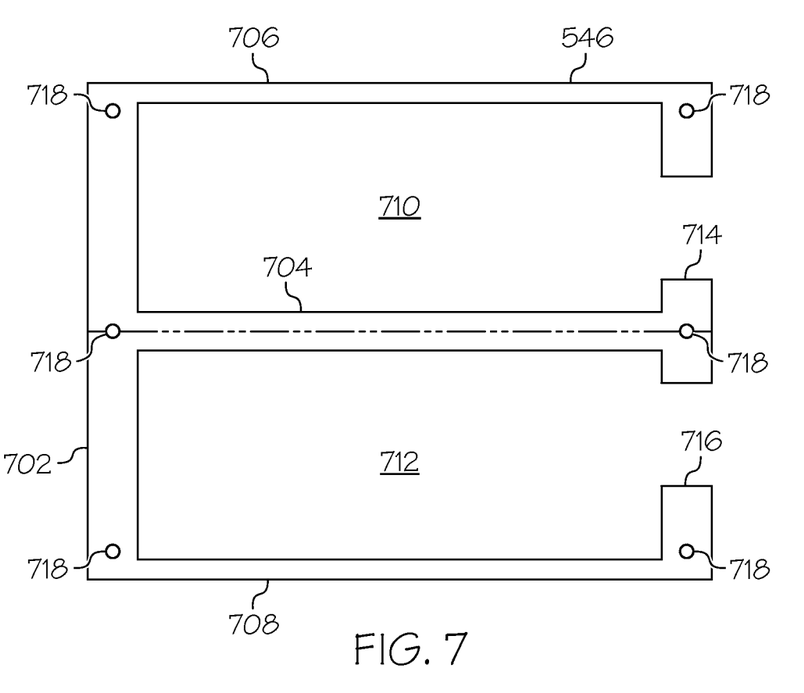
FIG. 7 is a top view of an example of a spacer plate or laminate in accordance with an embodiment of the present disclosure.

The electromagnetic device 500 may also include a spacer portion 542 and 544 disposed on each outside flux sensor core plate 526. Each spacer portion 542 and 544 may include a plurality of spacer plates 546 stacked on one another. The spacer plates 546 may be made from a non-magnetic material or material that is an electrical insulator or dielectric. Referring also to FIG. 7, FIG. 7 is a top view of an example of a spacer plate 546 or laminate in accordance with an embodiment of the present disclosure. The spacer plate 546 may be substantially "E" shaped as illustrated in FIG. 7. The spacer plate 546 may include a main segment 702, a center segment 704 extending from a central portion of the main member 702 and two outer segments 706 and 708 extending from opposite ends of the main segment 702. A plurality of spacer plates 546 stacked to form the spacer portions 542 and 544 provide openings 710 and 712 formed between the two outer segments 706 and 708 and the center segment 704 as in the embodiment illustrated in FIG. 7. The primary conductor windings 510 and secondary conductor windings 512 pass or extend through the openings 710 and 712.

Each spacer plate 546 may also include a gap or gaps 714 and 716 for the sensor conductor windings 534 and 538 that pass through each pair of sensor holes 528 and 530 (FIGS. 5 and 6) to connect to the core flux sensor device 536 for detecting the magnetic flux level at the location of each sensor conductor winding 534 and 538 and associated pair of sensor holes 528 and 530. Each spacer plate 546 may also include holes 718 which will align with holes 540 in the flux sensor core plates 526 to receive holding devices or fasteners for holding the components of the electromagnetic device 500 together.

The electromagnetic device 500 also includes a magnetic core portion 548 and 550 respectively disposed on each spacer portion 542 and 544. The elongated openings 506 and 508 extend through each magnetic core portion 548 and 550 and the primary and secondary conductor windings 510 and 512 extend or pass through each magnetic core portion 548 and 550.

Figure 8:
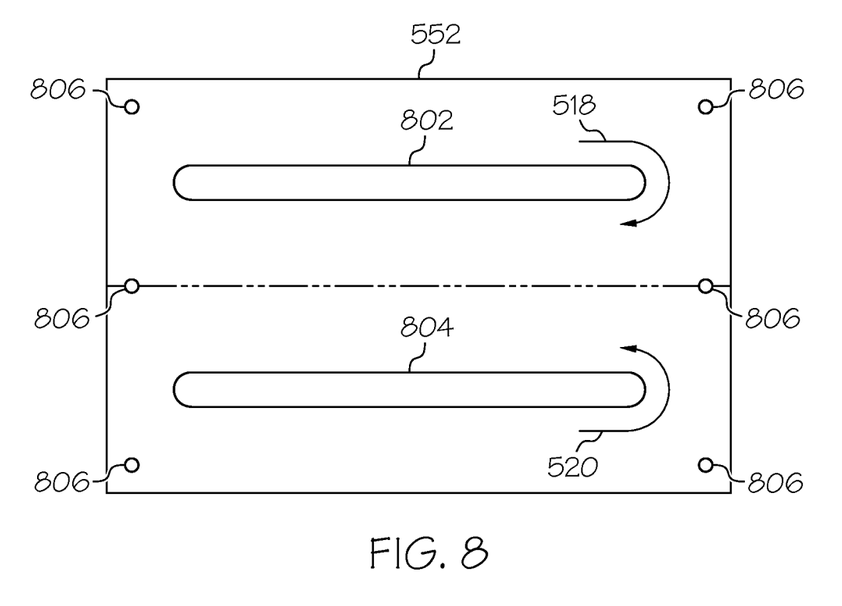
FIG. 8 is a top view of an example of a magnetic core plate or laminate in accordance with an embodiment of the present disclosure.

Each magnetic core portion 548 and 550 may include a plurality of magnetic core plates 552 or laminates stacked on one another as illustrated in the exemplary embodiment in FIG. 5. The plates 552 may be made from the same material as the sensor plates 524 that are capable of absorbing a magnetic flux as described herein. Referring also to FIG. 8, FIG. 8 is a top view of an example of a magnetic core plate 552 or laminate in accordance with an embodiment of the present disclosure. The magnetic core plate 552 includes a first elongated opening 802 which corresponds to opening 506 in FIG. 5 and a second elongated opening 804 which corresponds to opening 508. The second elongated opening 804 may be parallel to the first elongated opening 802 to permit the conductor winding or windings 510 and 512 to pass through the stacked magnetic core plates 552 forming the magnetic core portions 548 and 550. The openings 802 and 804 in each magnetic core plate 552 respectively form the openings 506 and 508 when the magnetic core plates or laminates are stacked together to form the magnetic core portions 548 and 550.

Each magnetic core plate 552 may also include a plurality of holes 806 which align with the openings 718 in the spacer plates 546 and openings 540 in the flux sensor core plates 526 for receiving a fastener or the like for assembling the magnetic flux core 504 of the electromagnetic device 500 (FIG. 5).

The core flux control system 502 (FIG. 5) may include a local manager 554 which may also be referred to as a core flux control device or may include a core flux control device similar to that described in U.S. patent application Ser. No. 13/953,314. The local manager 554 may be similar to the local mangers 110 in FIG. 1, 210 in FIGS. 2 and 412 in FIG.

4. The local manager 554 may be configured to adjust the electrical current flowing through the primary conductor winding 510 to control the magnetic flux level in the magnetic flux core 504 of the electromagnetic device 500. The local manager 554 may be coupled to the primary winding 510 and may receive control input signals corresponding to the magnetic flux level from the core flux sensor device 536. The local manager 554 may adjust the electrical current flowing through the primary conductor winding 510 in response to the magnetic flux level detected or measured by the core flux sensor device 536. Similar to that previously described, the local manager 554 may be configured to transmit magnetic flux level data sensed by the core flux sensor arrangement 522 to a central manager, such as central manager 102 in FIG. 1. The local manager 554 may then receive instructions from the central manager for configuring the electromagnetic device 500 or transformer similar to that described herein. The local manager 554 may configure the electromagnetic device by adjusting a number of turns in the primary conductor winding 510 so that a predetermined magnetic flux level may be maintained in the magnetic flux core 504. In accordance with an embodiment, the core flux control system 502 may include an additional winding or a control winding 556 or windings through the openings 506 and 508 of the magnetic core 504. The control winding 504 is coupled to the local manager 554. The local manager 554 may be adapted to connect the electrical power source 514 to the control winding 556 or windings and thereby adjust the number of turns of the primary winding 510. The local manager 554 in addition to being able to switch in or out the additional primary winding or control winding 556, may also control the amplitude or amount of current flowing in the control winding 556 to control the level of magnetic flux flow in the core 504 in response to signals or instructions from the central manager 106 FIG. 1 and/or based on the magnetic flux level in the core 504 sensed by the core flux sensor arrangement 522.

The core flux sensor arrangement 522 may detect the magnetic flux level in the magnetic flux core 504 when a peak source current is flowing through the primary conductor winding 510. The local manger 554 may be configured to increase the electrical current flow through the primary conductor winding 510 and/or control winding 556 in response to the magnetic flux level being lower than a predetermined level for the peak source current and to reduce the electrical current flowing through the primary conductor winding 510 and/or control winding 556 in response to the level of the magnetic flux flow being higher than the predetermined level for the peak current.

Figure 9:
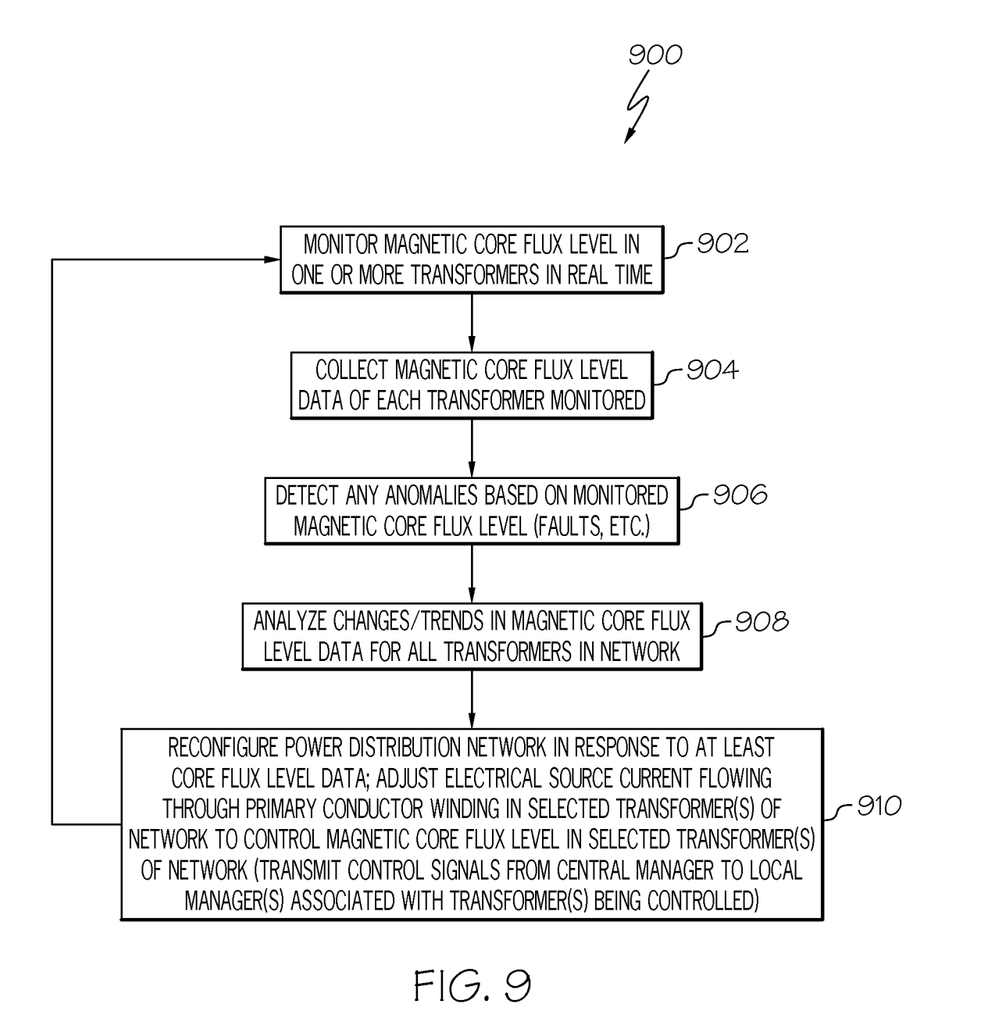
FIG. 9 is a flow chart of an example of a method for monitoring a magnetic core flux level in one or more transformers of an electrical power distribution network and controlling power distribution by the network in accordance with an embodiment of the present disclosure.

FIG. 9 is a flow chart of an example of a method 900 for monitoring a magnetic core flux level in one or more transformers of an electrical power distribution network and controlling power distribution by the network in accordance with an embodiment of the present disclosure. The method 900 may be embodied in any of the local managers 106 described with reference to FIG. 1 or the similar local managers described with reference to the other Figures. In block 902, the magnetic core flux level in one or more transformers in an electrical power distribution network or system may be monitored in real time. The magnetic flux level may be monitored by a local manager associated with each transformer and the magnetic flux level data may be transmitted to a central manager by the local manager for analysis as previously described.

In block 904, the magnetic flux core level data may be collected from each transformer monitored in the electrical power distribution network. The magnetic flux core level data may be collected by a central manager.

In block 906, any anomalies may be detected based on the monitored and collected magnetic core flux level data. For example, any faults or potential faults or other conditions that could result in possible harm to components of the electrical power distribution network or to equipment of consumers connected to the electrical power distribution network may be detected. The electrical power distribution network may be reconfigured to isolate any faults or other harmful conditions in response to any faults, potential faults or other conditions.

In block 908, any changes or trends in the magnetic core flux level data may be analyzed for all the transformers in the electrical power distribution network or system which are being monitored.

In block 910, the power distribution network or system may be reconfigured in response to at least the core flux level data. The network may be reconfigured by adjusting electrical source current flowing through the primary conductor windings in a selected transformer or transformers to control the magnetic core flux level in the selected transformer or transformers of the distribution network. Control signals may be transmitted from a central manager to a local manager or managers associated with the transformers being controlled or reconfigured as described herein. The method 900 may return to block 902 and the magnetic core flux level may continue to be monitored in one or more transformers in real time. The method 900 may then continue similar to that previously described.

Figure 10:
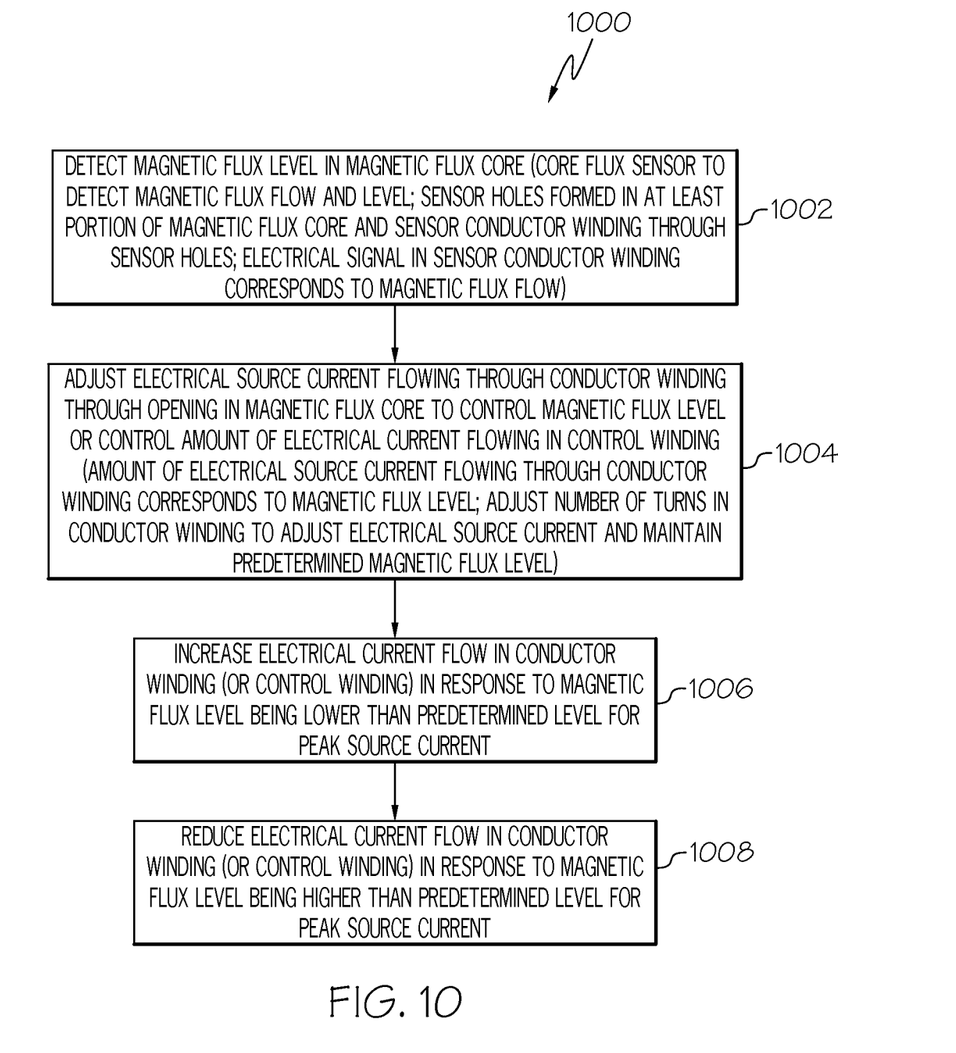
FIG. 10 is a flow chart of an example of a method for controlling magnetic flux in an electromagnetic device for power management in accordance with an embodiment of the present disclosure.

FIG. 10 is a flow chart of an example of a method 1000 for controlling magnetic flux in an electromagnetic device for power management in accordance with an embodiment of the present disclosure. The method of 1000 may be performed by the electromagnetic device 500 and the core flux control system 502 of FIG. 5 or a similar system. In block 1002, a magnetic flux flow in a magnetic flux core may be detected and a level of the magnetic flux flow in the core measured. As previously described, a core flux sensor arrangement may detect the magnetic flux flow and level in the magnetic flux core. At least one pair of sensor holes may be formed in at least a portion of the magnetic core similar to that previously described and a sensor conductor winding may be passed through the at least one pair of sensor holes forming a loop sensor antenna for detecting the magnetic flux flow and level. The magnetic flux flow causes an electrical signal to be generated in the sensor conductor winding or loop antenna. An amplitude of the electrical signal corresponds to the magnetic flux level in the magnetic flux core.

In block 1004, an electrical current flowing through a conductor winding passing through the magnetic flux core may be adjusted in response to the magnetic flux level detected or measured to control the magnetic flux level in the core. Alternatively or in addition, electrical current in a control winding may be adjusted in response to the magnetic flux level detected or measured in the core to control the flux flow level in the core by increasing or decreasing the current. The magnetic flux level may also be controlled or adjusted by adjusting the number of turns of the primary winding to maintain a predetermined magnetic flux level.

In block 1006, electrical current flowing in a primary conductor winding or a control winding may be increased in response to the magnetic flux level being lower than a predetermined level for a peak source current.

In block 1008, electrical current flowing in a primary conductor winding or a control winding may be reduced in response to the magnetic flux level being higher than the predetermined level or the peak source current.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure. The following claims are in no way intended to limit the scope of the disclosure to the specific embodiments described herein.

What is claimed is:

1. An electrical power distribution network, comprising:
    a plurality of transformers, each transformer comprising a magnetic flux core and an opening through the magnetic core;
    a local manager associated with each transformer, each local manager configured to monitor and control a magnetic flux level in the magnetic flux core of the associated transformer;
    a central manager configured to receive magnetic flux level data from each local manager and control operation of each local manager in response to the magnetic flux level data;
    a core flux sensor arrangement associated with each transformer to detect a magnetic flux flow in the magnetic flux core of the associated transformer to control the magnetic flux flow in the magnetic flux core, wherein the core flux sensor arrangement comprises:
        a first pair of sensor holes formed through magnetic material of at least a portion of the magnetic flux core in a path of the magnetic flux flow, the first pair of sensor holes being positioned relative to the opening through the magnetic flux core for sensing the magnetic flux flow while minimizing disruption of the magnetic flux flow in the magnetic flux core; and
        a first sensor conductor winding through the first pair of sensor holes, the magnetic flux flow generating a first electrical signal in the first sensor conductor winding, the first electrical signal in the first sensor conductor winding corresponding to the magnetic flux flow at a location of the first sensor conductor winding.

2. The electrical power distribution network of claim 1, wherein the central manager is configured to analyze the magnetic flux level data from each local manager and transmit an individual instruction to at least some local managers for controlling the magnetic flux level in the associated transformer in response to the analysis of the magnetic flux level data.

3. The electrical power distribution network of claim 1, wherein the central manager is configured to control a level of electrical power transmitted on a power distribution circuit to an electrical power end user.

4. The electrical power distribution network of claim 1, wherein the central manager is configured to integrate the magnetic flux level data from each of the local managers and evaluate performance of the electrical power distribution network.

5. The electrical power distribution network of claim 1, wherein the central manager is configured to detect a fault from analysis of the magnetic flux level data and to isolate the fault by transmitting an instruction to the local manager associated with the fault, the local manger configuring the associated transformer to isolate the fault in response to the instruction.

6. The electrical power distribution network of claim 1, wherein the central manager is configured to set at least one local manager parameter, the local manager configuring the associated transformer in response to the at least one local manager parameter.

7. The electrical power distribution network of claim 1, further comprising a network model associated with the central manager, wherein the central manager is configured to modify the network model to match a configuration of the electrical power distribution network in response to a change in the configuration of the electrical power distribution network.

8. The electrical power distribution network of claim 1, wherein the local manager is configured to receive the magnetic flux level data and to adjust an electrical current flowing through a conductor winding of the associated transformer to control the magnetic flux flow in the magnetic flux core.

9. The electrical power distribution network of claim 1, wherein each transformer further comprises:
    a conductor winding received in the opening and extending through the magnetic flux core, wherein an electrical current flowing through the conductor winding generates a magnetic field about the conductor winding and the magnetic flux flow about the opening in the magnetic flux core.

10. The electrical power distribution network of claim 1, wherein the core flux sensor arrangement comprises:
    a second pair of sensor holes formed through at least the portion of the magnetic flux core, the second pair of sensor holes for use in sensing the magnetic flux flow at a location of the second pair of sensor holes; and
    a second sensor conductor winding through the second pair of sensor holes, the magnetic flux flow generating a second electrical signal in the second sensor conductor winding, the second electrical signal in the second sensor conductor winding corresponding to the magnetic flux flow at the location of the second sensor conductor winding.

11. The electrical power distribution network of claim 1, wherein a conductor winding is received in the opening and extends through the magnetic core, the electric current flowing through the conductor winding generates a magnetic field about the conductor winding and generates the magnetic flux flow about the opening in the magnetic flux core and wherein the first pair of sensor holes are positioned relative to the opening through the magnetic flux core for sensing the magnetic flux flow at the location of the first sensor conductor winding.

12. The electrical power distribution network of claim 11, wherein the core flux sensor arrangement further comprises:
    a second pair of sensor holes formed through at least the portion of the magnetic flux core at a greater distance from the opening than the pair of sensor holes, the second pair of sensor holes for use in sensing the magnetic flux flow at a location of the second pair of sensor holes; and a second sensor conductor winding through the second pair of sensor holes, the magnetic flux flow generating a second electrical signal in the second sensor conductor winding, the second electrical signal in the second sensor conductor winding corresponding to the magnetic flux flow at the location of the second sensor conductor winding.

13. The electrical power distribution network of claim 1, wherein the local manager is configured to transmit magnetic flux level data to the central manager of the power distribution network and to receive instructions from the central manager to control the magnetic flux level in the magnetic flux core of the associated transformer.

14. A transformer for use in a power distribution network, comprising:

a magnetic flux core;

an opening through the magnetic flux core;

a conductor winding received in the opening and extending through the magnetic flux core, wherein an electrical current flowing through the conductor winding generates a magnetic field about the conductor winding and a magnetic flux flow about the opening in the magnetic flux core;

a core flux sensor arrangement to detect a magnetic flux level in the magnetic flux core, wherein the core flux sensor arrangement comprises:

a first pair of sensor holes formed through magnetic material of at least a portion of the magnetic flux core in a path of the magnetic flux flow, the first pair of sensor holes being positioned relative to the opening through the magnetic flux core for use in sensing the magnetic flux flow while minimizing disruption of the magnetic flux flow in the magnetic flux core; and a first sensor conductor winding through the first pair of sensor holes, the magnetic flux flow generating a first electrical signal in the first sensor conductor winding, the first electrical signal in the first sensor conductor winding corresponding to the magnetic flux flow at a location of the first sensor conductor winding;

a local manager associated with the transformer and configured to control the magnetic flux level in the magnetic flux core.

15. The transformer of claim 14, wherein the core flux sensor arrangement comprises:

a second pair of sensor holes formed through at least the portion of the magnetic flux core at a greater distance from the opening than the pair of sensor holes, the second pair of sensor holes for use in sensing the magnetic flux flow at a location of the second pair of sensor holes; and a second sensor conductor winding through the second pair of sensor holes, the magnetic flux flow generating a second electrical signal in the second sensor conductor winding, the second electrical signal in the second sensor conductor winding corresponding to the magnetic flux flow at the location of the second sensor conductor winding.

16. The transformer of claim 14, wherein the local manager is adapted to adjust a number of turns in the conductor winding to maintain a predetermined magnetic flux level in the magnetic flux core.

17. The transformer of claim 14, further comprising a control winding through at least a portion of the magnetic flux core, wherein the local manager increases or decreases an amount of electrical current flowing in the control winding to control the magnetic flux level in the core.

18. A method for monitoring and controlling operation of an electrical power distribution network:

providing monitoring and control of a magnetic flux level in a magnetic flux core of each of a plurality of transformers of the electrical power distribution network, each magnetic flux core comprising an opening through the magnetic flux core;

providing a pair of sensor holes formed through magnetic material of at least a portion of the magnetic flux core of each transformer, the pair of sensor holes being positioned relative to the opening through the magnetic flux core for sensing the magnetic flux level in the magnetic flux core while minimizing disruption of a magnetic flux flow in the magnetic flux core;

providing a sensor conductor winding through the pair of sensor holes, the magnetic flux flow generating an electrical signal in the sensor conductor winding, the electrical signal in the sensor conductor winding corresponding to the magnetic flux flow at a location of the sensor conductor winding;

collecting magnetic flux level data from each of the plurality of transformers; and reconfiguring the power distribution system in response to the magnetic flux level data to prevent harm to the electrical power distribution network and any equipment coupled to the power distribution network.

19. The method of claim 18, wherein reconfiguring the power distribution system comprises removing electrical power from a component in response to determining that an amount of electrical power exceeding a predetermined threshold is about to be applied to the component.

20. The method of claim 18, further comprising:

detecting the magnetic flux level in the magnetic flux core of each transformer; and adjusting an electrical source current flowing through a conductor winding extending through the opening in the magnetic flux core of each transformer to control the magnetic flux level in the magnetic flux core, an amplitude of the electrical source current flowing through the conductor winding corresponds to the magnetic flux level.

* * * * *